United States Patent
Kawahara

(10) Patent No.: US 6,734,739 B2
(45) Date of Patent: May 11, 2004

(54) FRACTIONAL-FREQUENCY-MODULATION PLL SYNTHESIZER THAT SUPPRESSES SPURIOUS SIGNALS

(75) Inventor: Tadashi Kawahara, Tokyo (JP)

(73) Assignee: Mitsubishikdenki Kabushiki Kaisha, Tokyo (JP)

( * ) Notice: Subject to any disclaimer, the term of this patent is extended or adjusted under 35 U.S.C. 154(b) by 13 days.

(21) Appl. No.: 10/283,119

(22) Filed: Oct. 30, 2002

(65) Prior Publication Data

US 2003/0222723 A1 Dec. 4, 2003

(30) Foreign Application Priority Data

Jun. 3, 2002 (JP) ......................................... 2002-161466

(51) Int. Cl.$^7$ ........................ H03L 7/089; H03D 13/00; G01R 25/00
(52) U.S. Cl. ............................. 331/25; 331/8; 331/16; 331/17; 331/1 A; 327/12; 327/156; 327/157; 327/159
(58) Field of Search ................................. 331/1 A, 8, 16, 331/17, 18, 25, 57; 327/2, 7, 8, 12, 156–159; 332/127; 360/51; 375/376; 455/260

(56) References Cited

U.S. PATENT DOCUMENTS 4,020,422 A * 4/1977 Underhill ....................... 327/12
5,712,582 A    1/1998 Yokota et al.

FOREIGN PATENT DOCUMENTS

JP      9-5408      1/1997
JP      9-26467     1/1997

* cited by examiner

*Primary Examiner*—David Mis
(74) *Attorney, Agent, or Firm*—Leydig, Voit & Mayer, Ltd.

(57) ABSTRACT

The phase comparator in a phase locked loop synthesizer has a identical first and second transmission gates connected to a front row and a back row of 2N−1 gate delay elements, respectively. Third and fourth transmission gates are permanently set to an ON setting. The first transmission gate and NAND gates operate as a gate delay element when a COUNT signal is at a low logical level and operate as a ring oscillator when the COUNT signal is at a high logical level.

6 Claims, 6 Drawing Sheets

FRACTIONAL-FREQUENCY-MODULATION PLL SYNTHESIZER THAT SUPPRESSES SPURIOUS SIGNALS

BACKGROUND OF THE INVENTION

1) Field of the Invention

The present invention is related to a fractional-frequency-modulation phase-locked-loop (PLL) synthesizer that suppresses spurious elements.

2) Description of the Related Art

A fractional-frequency-modulation PLL synthesizer allows fractional (sub-decimal point) frequency modulation settings as an average frequency modulation by periodically switching frequency modulation of variable frequency divider. The fractional-frequency-modulation-type PLL synthesizer has two prominent merits as explained below:

(1) It is possible to reduce frequency modulation by a variable frequency divider owing to a higher reference frequency (phase comparator frequency) setting than that of channel resolution. This leads to an increase in PLL loop gain, enabling a reduction in frequency switching time.

(2) It is possible to reduce in-phase noise due to the reduction of frequency modulation of the variable frequency divider.

FIG. 3 shows the basic configuration of a conventional fractional-frequency-modulation PLL synthesizer. In this diagram, reference numeral 1 represents a reference oscillator, 2 a reference frequency divider, 3 a phase comparator, 4a a charge pump circuit, 5 a loop filter, 6 a voltage control oscillator, 7 a variable frequency divider, 8 a frequency changing circuit, 9 a shift resistor, 10 an adder, 11 an accumulator and 13a a charge pump bias circuit.

The operation of the conventional fractional-frequency-modulation PLL synthesizer is explained with the help of FIG. 3 and FIG. 4. As shown in FIG. 3, the reference oscillator 1 generates a signal Fosc and supplies the generated signal to the reference frequency divider 2. The reference frequency divider 2 divides the signal Fosc to obtain a reference frequency signal Fref. The reference frequency divider 2 feeds the reference frequency signal Fref to the phase comparator 3. The phase comparator 3 compares a signal received from the variable frequency divider 7 with the reference frequency signal Fref and generates an UP or a DOWN signal based on the comparison and sends the UP or the DOWN signal to the charge pump circuit 4a. The charge pump circuit 4a outputs a current value to the loop filter 5. The loop filter 5 converts the current value into a voltage value and supplies the voltage value to the voltage control oscillator 6. The voltage control oscillator 6 generates a signal Fvco from the received voltage value and supplies the signal Fvco into the variable frequency divider 7. Thus, a PLL is formed.

In the case of an integer (whole number) frequency PLL, the integer frequency is directly supplied to variable frequency divider 7. In the case of a fractional frequency PLL, however, the shift register 9 gets connected, forming frequency changing circuit 8 and enables equivalent fractional frequency modulation through periodic supply of N or N+1 frequency to the variable frequency divider 7. In the shift register 9, the value of frequency modulation of the variable frequency divider 7 is set beforehand. Integer frequency values are sent to the adder 10 in the frequency switching circuit while fractional frequency values are sent to the accumulator 11. To be precise, the frequency switching circuit 8 changes the frequency to N+1 only m out of 2k times of reference frequency Fref signal pulses. For the rest 2k-m times, the frequency is changed to N, thereby enabling an average setting of frequency modulation equivalent to (N+m)/2k.

As an example, FIG. 4 shows the relationship between the reference frequency Fref, output of the variable frequency divider 7, and the phase error output signal when m=1 and K=2, i.e., when modulation is (N+1)/4. In this example, of 4 outputs of the variable frequency divider 7, only 3 outputs are divided by N while for the remaining output is divided by N+1. The average frequency for 4 outputs is (N+1)/4. Due to generation of phase error with reference frequency Fref, the amount of phase error (in this case phase advancement) is sent to the phase comparator 3 in the form of a signal. Since the cycle of this signal is 4 times that of the reference frequency Fref, a spurious frequency equivalent to ¼ th of the reference frequency is generated.

Owing this, conventionally, the charge pump bias circuit 13a is provided as shown in FIG. 5. This charge pump bias circuit 13a takes the output of the accumulator 11 as its input and delivers its output to the charge pump circuit 4a. The charge pump bias circuit 13a takes ICPMBIAS as standard bias current and is constituted of K units of current Miller circuits in which transistor size is changed so as to make the Miller current 1:21:22: . . . :2k−1. N channel MOS transistor drain serves as a commonly connected output to the charge pump bias circuit 13a and it is also connected to P channel MOS transistor drain which serves as a standard bias current source for charge pump circuit 4a. Further, the output of the accumulator 11 (K bit in the case of FIG. 5) is connected to N channel MOS transistor gate in such a way that lower bits are connected to lower Miller ratio circuits and higher bits are connected to higher Miller ratio circuits.

The charge pump bias circuit 13a thus formed generates an output proportionate to the signal input from the accumulator 11 which exclusively gets added to the source current of charge pump circuit 4a.

The charge pump circuit 4a, on the other hand, takes ICPBIAS as a reference bias current and multiplies the current value by N times according to the Miller ratio of the current Miller circuit. An arrangement is made in such a way that a source current is sent out from PMOS transistor in accordance with UP signal from phase comparator 3 while sync-current flows from NMOS transistor in accordance with DOWN signal from phase comparator 3.

As a result of this arrangement, the phase error of fractional-frequency-modulation PLL used to be cancelled by the addition of phase error compensation current (spurious cancel current) proportional to the value of the output signal of accumulator 11 used in fractional frequency modulation to the source current of the charge pump circuit 4a.

According to the conventional art, the time for which phase error compensation current addition takes place is equivalent to gate delay generated due to a dead band of the phase comparator 3 as shown in FIG. 6. That is, it is the time for which a charge pump current sync-source is switched on simultaneously.

However, the gate delay time of the phase comparator 3 varies with manufacturing variation in the elements, operating temperature and operating source voltage etc. This in effect leads to variation in the amount of spurious signal suppression. Especially, in the case of application in wireless equipments like cellular/mobile phones, the spurious signal works as an interference and creates problems.

As a result, conventionally, as shown in FIG. 7, a separate ring oscillator circuit having the same elements as the delay gate is provided to suppress fluctuation in the amount/degree of suppression of a spurious signal. The oscillation cycle of this ring oscillator circuit is monitored to generate a spurious cancel current proportional to the oscillation cycle as a bias source has been also provided.

However, even in such cases, it is not possible to eliminate variation between gate elements resulting from reasons like manufacturing variation etc. Moreover, when the amount of variation is large, the degree of spurious signal suppression gets deteriorates and poses an operational problem that needs to be solved.

SUMMARY OF THE INVENTION

It is an object of this invention to provide a fractional-frequency-modulation-type PLL synthesizer that suppresses the spurious signal despite presence of the manufacturing variation in the gate elements.

The fractional-frequency-modulation-type PLL synthesizer according to the present invention includes a phase comparator. The phase comparator includes a gate delay element that operates as a ring oscillator when locking a specific frequency. Moreover, the gate delay element prevents a dead band in the event of fractional frequency operation.

These and other objects, features and advantages of the present invention are specifically set forth in or will become apparent from the following detailed descriptions of the invention when read in conjunction with the accompanying drawings.

DETAILED DESCRIPTIONS

Figure 8:
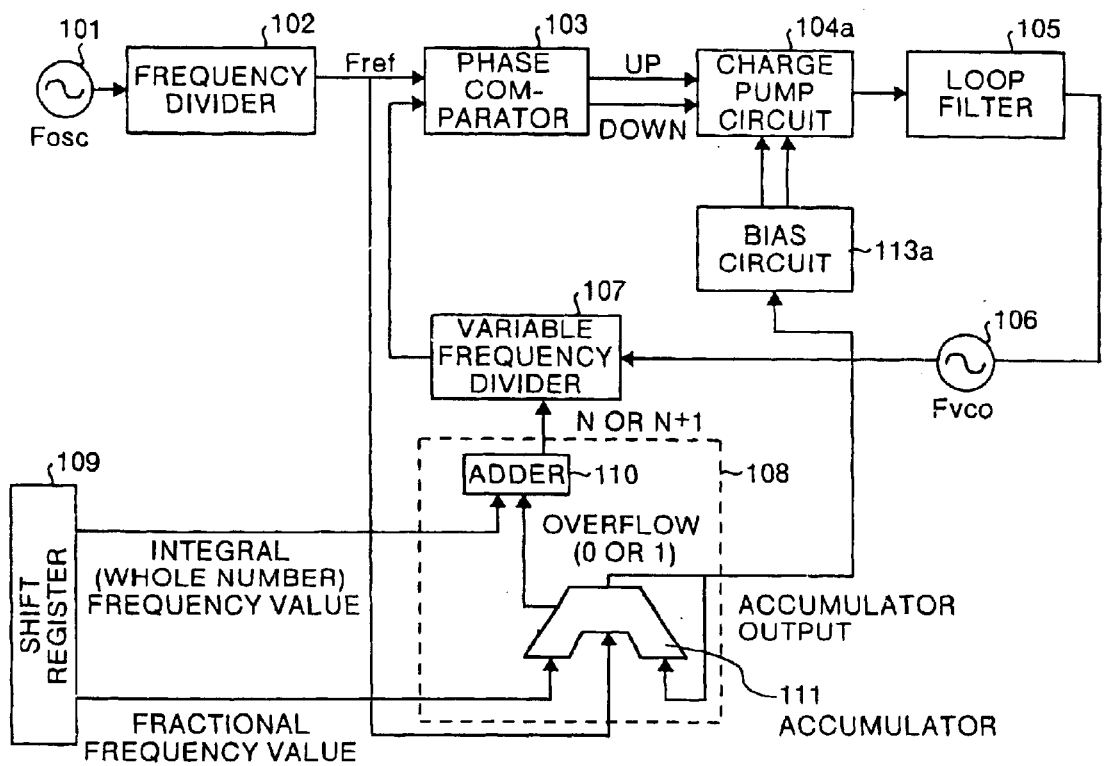
FIG. 8 is a block diagram of the fractional-frequency-modulation PLL synthesizer according to the embodiment of the present invention.

FIG. 8 shows the basic configuration of the fractional-frequency-modulation-type PLL synthesizer according to the present invention. In this diagram, reference numeral 101 represents reference oscillator, 102 reference frequency divider, 103 phase comparator, 104a charge pump circuit, 105 loop filter, 106 voltage control oscillator, 107 variable frequency divider, 108 frequency change-over circuit, 109 shift register, 110 adder, 111 accumulator and 113a charge pump bias circuit.

Figure 4:
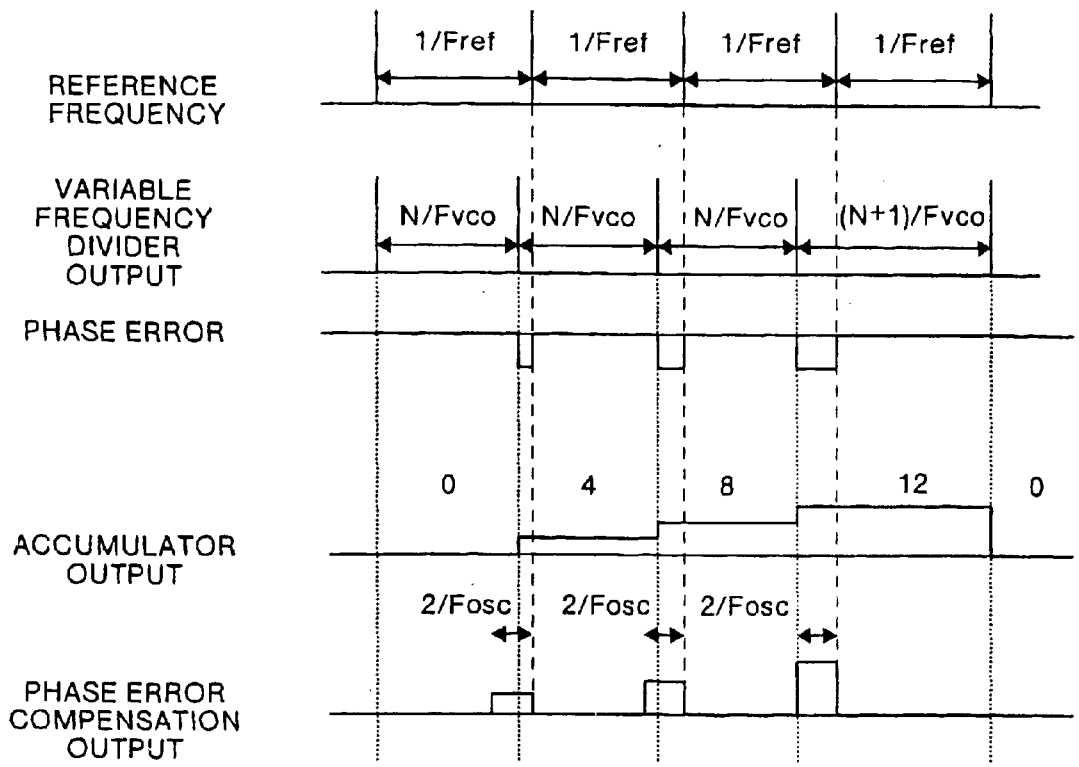
FIG. 4 is a diagram for explaining the relationship between a reference frequency signal, output signal of a variable frequency divider, and phase error output signal.
Figure 5:
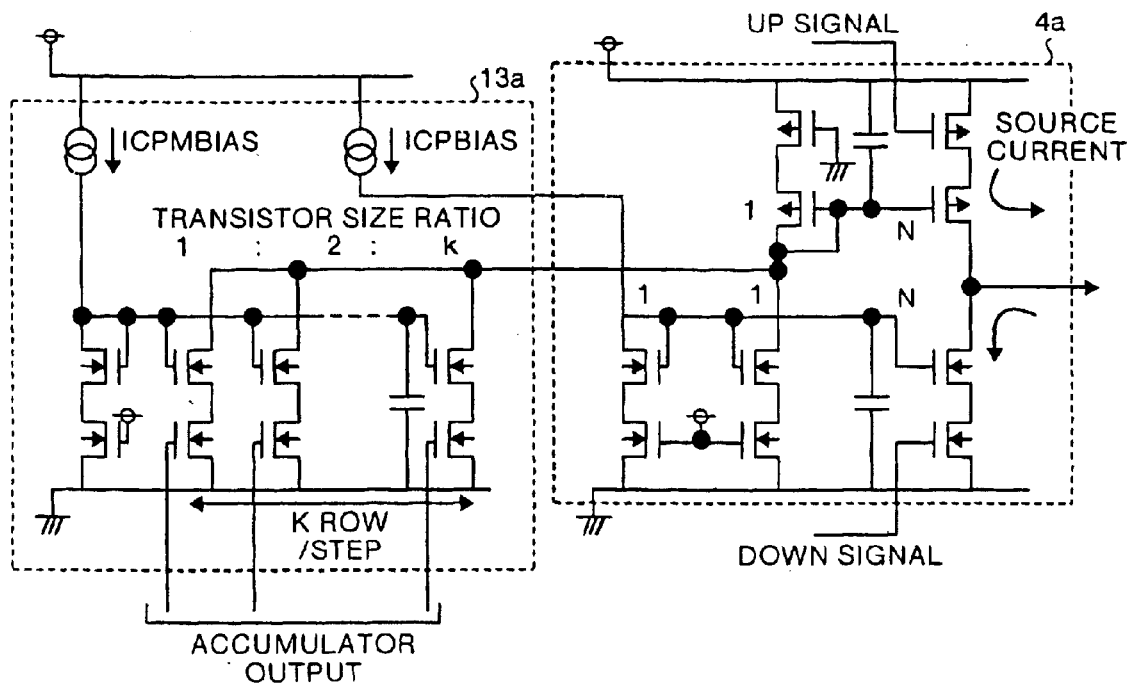
FIG. 5 shows the conventional charge pump circuit and the charge pump bias circuit.

The operation of the fractional-frequency-modulation-type PLL synthesizer is explained with the help of FIG. 8 and FIG. 4. As shown in FIG. 8, the reference oscillator 101 generates a signal Fosc and inputs the generated signal into the reference frequency divider 102. The reference frequency divider 102 divides the signal Fosc to obtain a reference frequency signal Fref. The reference frequency divider 102 feeds the reference frequency signal Fref to the phase comparator 103. The phase comparator 103 compares a signal received from the variable frequency divider 107 with the reference frequency signal Fref and generates an UP or a DOWN signal based on the comparison and sends the UP or the DOWN signal to the charge pump circuit 104a. The charge pump circuit 104a outputs a current value to the loop filter 105. The loop filter 105 converts the current value into a voltage value and supplies the voltage value to the voltage control oscillator 106. The voltage control oscillator 106 generates a signal Fvco from the received voltage value and inputs the signal Fvco into the variable frequency divider 107. Thus, a PLL is formed.

In the case of an integer (whole number) frequency PLL, integral frequency is directly supplied to variable frequency divider 107. In the case of fractional frequency PLL according to the present invention, however, the shift resistor 109 gets connected fanning frequency change-over circuit 108 and enables equivalent fractional frequency modulation through periodical supply of N or N+1 frequency to the variable frequency divider 107. In the shift register 109, the value of frequency modulation of the variable frequency divider 107 is set beforehand. Integral frequency values are sent to the adder 110 in the frequency change-over circuit while fractional frequency values are sent to the accumulator 111. To be precise, the frequency change-over circuit 108 changes the frequency to N+1 only m out of 2k times of reference frequency Fref signal pulses. For the rest 2k-m times, frequency is changed to N thereby enabling an average setting of frequency modulation equivalent to (N+m)/2k.

As an example, FIG. 4 shows the relationship between the reference frequency Fref, output of the variable frequency divider 107, and the phase error output signal when m=1 and K=2 i.e. when modulation is (N+1)/4. In this example, out of 4 outputs of the variable frequency divider 107, only 3 times it is divided by N while for the remaining 1 time it is divided by N+1. The average frequency for 4 outputs is (N+1)/4. Due to generation of phase error with reference frequency Fref, the amount of phase error (in this case phase advancement) is sent to the phase comparator 103 in the form of a signal. Since the cycle of this signal is 4 times that of the reference frequency Fref, a spurious frequency equivalent to ¼ th of the reference frequency is generated.

Figure 9:
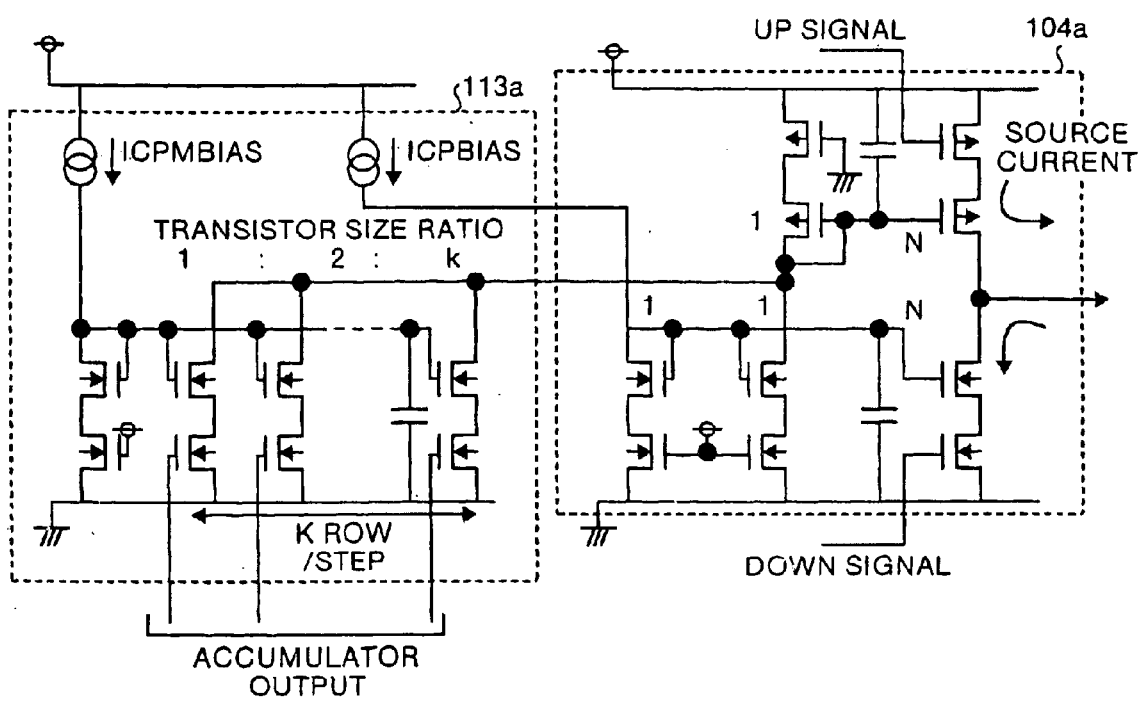
FIG. 9 shows the charge pump circuit and the charge pump bias circuit according to the embodiment of the present invention.

Owing this, the charge pump bias circuit 113a is provided as shown in FIG. 9. This charge pump bias circuit 113a takes the output of the accumulator 111 as its input and delivers its output to the charge pump circuit 104a. The charge pump bias circuit 113a takes ICPMBIAS as standard bias current and is constituted of K units of current Miller circuit in which transistor size is changed so as to make the Miller current 1:21:22: . . . :2k−1. N channel MOS transistor drain serves as a common connected output to the charge pump bias circuit 113a and it is also connected to P channel MOS transistor drain which serves as a standard bias current source for charge pump circuit 104a. Further, the output of the accumulator 111 (K bit in the case of FIG. 9) is connected to N channel MOS transistor gate in such a way that lower bits are connected to lower Miller ratio and higher bits are connected to higher Miller ratio.

The charge pump bias circuit 113a thus formed generates output proportionate to the signal input from the accumulator 111 which exclusively gets added to the source current of charge pump circuit 104a.

The charge pump circuit 104a, on the other hand, takes ICPBIAS as a reference bias current and multiplies the current value by N times according to the Miller ratio of current Miller circuit. An arrangement is made in such a way that source current is send out from PMOS transistor in accordance with UP signal from phase comparator 103 while sync-current flows from NMOS transistor in accordance with DOWN signal from phase comparator 103.

As a result of this arrangement, the phase error of fractional-frequency-modulation-type PLL used to be cancelled out by the addition of phase error compensation current (spurious cancel current) proportionate to the value of the output signal of accumulator 111 used in fractional frequency modulation to the source current of the charge pump circuit 104a.

Figure 1:
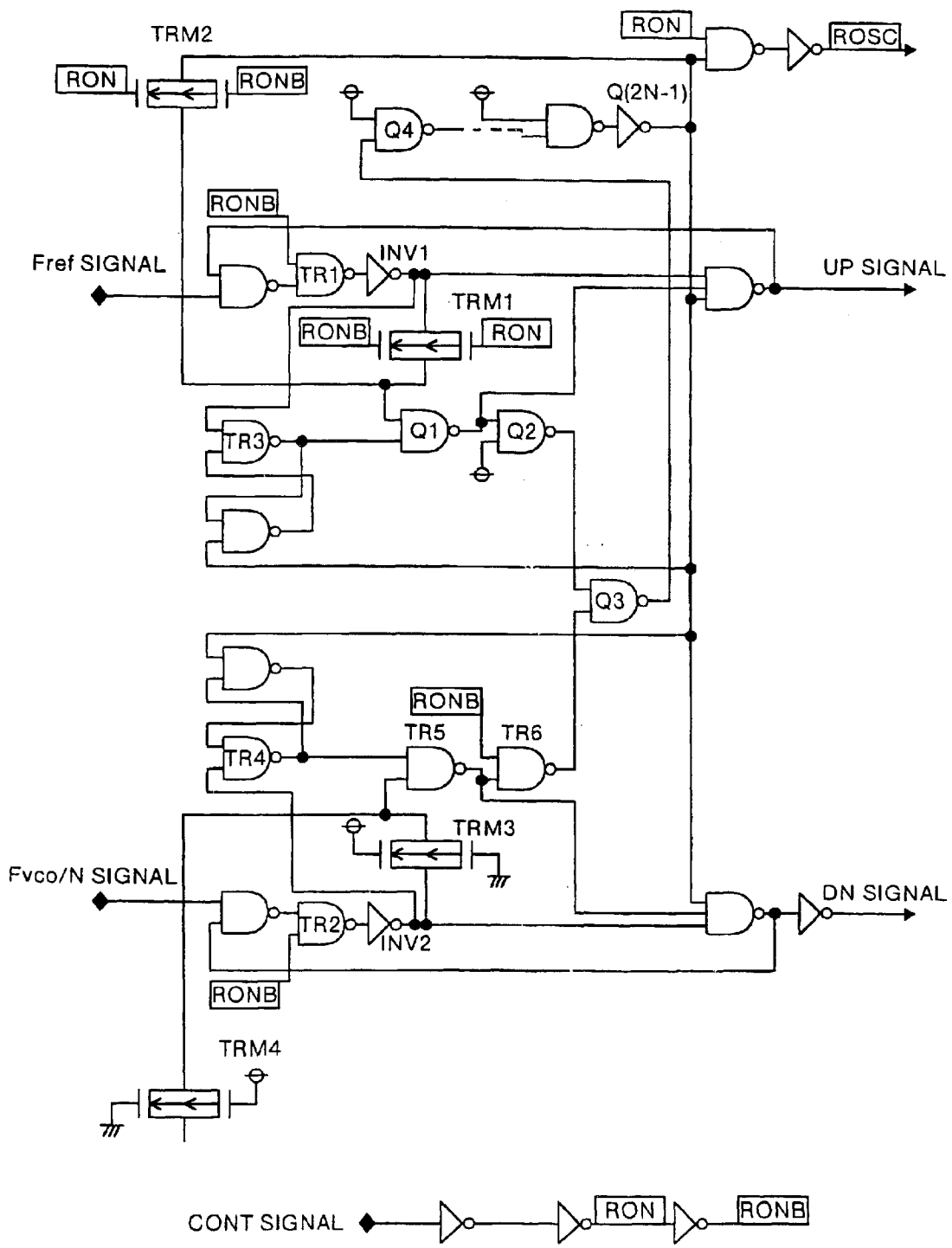
FIG. 1 is a circuit diagram of a phase comparator according to an embodiment of the present invention.

The phase comparator 103 is explained in detail as follows. FIG. 1 shows a configuration of the phase comparator 103 shown in FIG. 8. Reference symbols Q1 to Q(N−1) and TR1 to TR6 represent NAND gates (gate delay elements). Reference symbols INV1 and INV2 represent invertors. Reference symbols TRM1 to TRM4 represent transmission gates. Reference symbols RON, RONB, and RONC represent signals.

Figure 6:
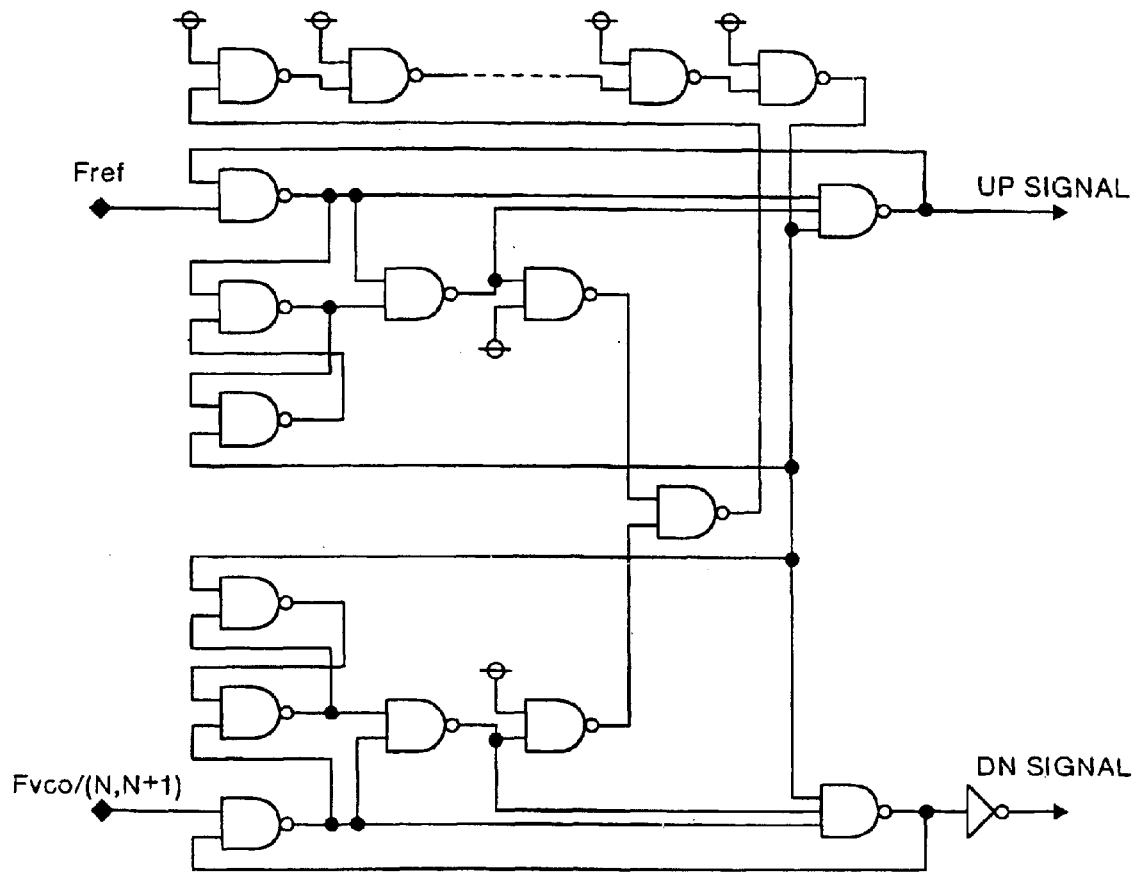
FIG. 6 is a circuit diagram of the conventional phase comparator.
Figure 7:
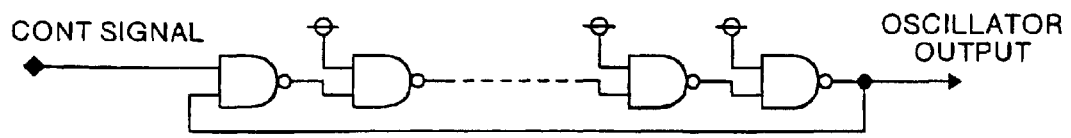
FIG. 7 is a circuit diagram of the conventional ring oscillator.

The phase comparator in FIG. 1 differs from its conventional counterpart shown in FIG. 6 in the following respects. That is, transmission gates TRM1 and TRM2 of identical shape are connected to the front and back row of gate delay elements (composed of Q1, Q2, . . . , Q (2N−1)) A delay time due to the phase comparator depends on the sum of delay times of the transmission gate TRM1 and the NAND gates Q1 to Q(2N−1).

Further, transmission gates TRM3 and TRM4 are provided that are permanently set to ON setting. The transmission gate TRM 3 is inserted to maintain constant simultaneous ON width irrespective of phase advance or delay of Fvco/N. The transmission gate TRM 4, on the other hand, has a shape identical to that of the transmission gate TRM 2, and is connected for equalizing parasitic capacity.

CONT signal here functions as a control signal determining if transmission gate TRM 1 and NAND gate Q1 to Q(2N−1) should operate as a gate delay element or as a ring oscillator. The set signal used at the time revising/altering PLL frequency can be used for this purpose. RON signal has the same phase as that of the CONT signal while the RONB has the reverse phase.

When CONT signal is of low logical level (CONT=L), RON signal also takes low logical level (RON=L), RONB signal takes high logical level (RONB=H). As a result, the transmission gate TRM 1 is ON and transmission gate TRM 2 is OFF. In this case, the circuit shown in FIG. 1 performs the same operation as that of convention phase comparator yielding the UP signal of low logical level output or the DOWN signal of high logical level output for the period of time equivalent to a phase difference between Fref and Fvco/N signals.

Figure 2:
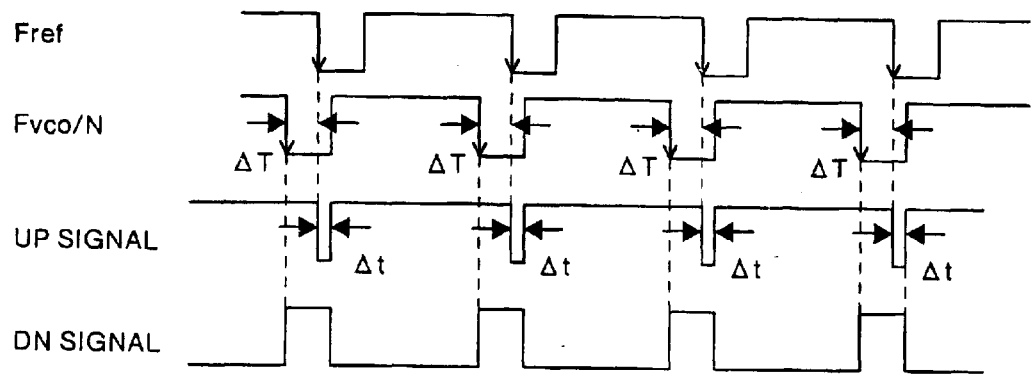
FIG. 2 shows wave-forms of signals output from the phase comparator shown in FIG. 1.
Figure 3:
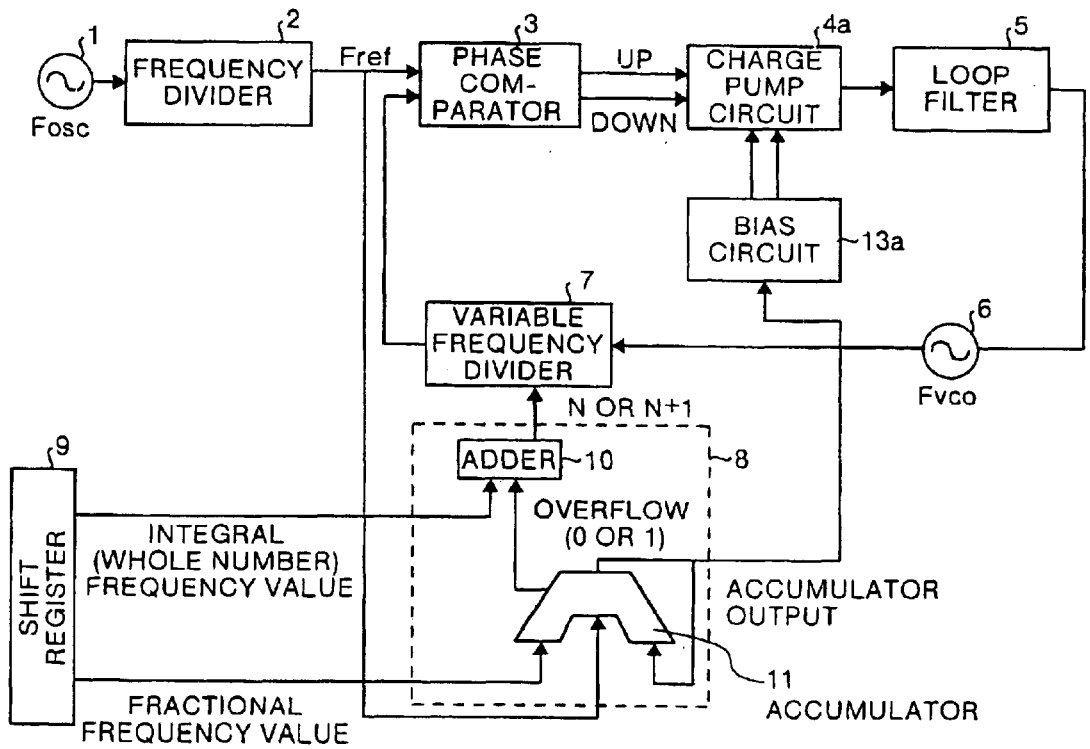
FIG. 3 is block diagram of the conventional fractional-frequency-modulation PLL synthesizer.

FIG. 2 explains the operation of phase comparator when CONT=L. When Fvco/N signal, which is ahead in phase as compared to Fref by T, goes as a input, the DOWN signal yields high logical level output ahead of UP signal. The DOWN signal yields low logical level output after a lag of T.

Conversely, when Fvco/N signal, which is behind in phase compared to Frev by T, goes as a n input, the DOWN signal yields high logical level output after UP signal, leading to delay equivalent to T.

The time t for which both the UP signal and the DOWN signal are ON is provided in order to prevent dead band of phase comparator. The delay is depends on the transmission gate TRM1 and the NAND gates Q1 to Q(2N−1).

When the CONT signal is of high logical level (CONT= H), the RON signal becomes high logical level (RON=H), and the RONB signal becomes low logical level (RONB=L). As a result, the transmission gate TRM1 is switched OFF and the transmission gate TRM2 is switched ON. Further, the output signal of the NAND gate TR1 and TR2 gets fixed to high logical level since the RONB signal is at low logical level. Polarity reverses due to the invertors INV1 and INV2 and since the input of one side of the NAND gates TR3 and TR4 gets fixed to low logical level, the output of the NAND gates TR3 and TR4 gets fixed to high logical level consequently. Also, since the input of one side of the NAND gate TR6 is RONB (which is at low logical level), the output gets fixed to a high logical level. In this way, the transmission gate TRM1, the NAND gates Q1 to Q(2N−1), and the transmission gate TRM2 are connected in a loop form which operates as a ring oscillator since the phase gets reversed in the odd numbered rows of the transistor. As the frequency of the oscillator is reciprocal of 2 times of gate delay time, monitoring the oscillation cycle of this ring oscillator, which also means monitoring ROSC, in effect is equivalent to measurement of the delay time.

With such a type of construction, the adverse effect of manufacturing variation among elements is eliminated since the gate delay element are constituted within the phase comparator itself, enabling to achieve phase comparator capable of suppressing desired spurious signal. By using the phase comparator according to the present invention in the fractional-frequency-modulation-type PLL synthesizer, it is possible to suppress desired spurious signal even though the adverse effect of manufacturing variation are generated among elements.

In FIG. 1, the gate delay element is constituted of NAND element and inverter. However, the gate delay element may be formed with inverter alone.

The fractional-frequency-modulation-type PLL synthesizer according to the present invention has following merits. That is, it becomes possible to control variation in the degree of suppression of spurious frequency levels generated by fractional compensation peculiar to fractional modulation type PLL frequency synthesizer by the provision of gate delay element that operates as a ring oscillator in the event of locking required frequency and as a dead band prevention delay element in the event of fractional frequency modulation operation. Moreover, the gate delay element can be easily formed as it is switched by transmission gates. Furthermore, the transmission gate can be easily formed without generating a special control signal as it is controlled by set signal used for frequency alternation.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A fractional-frequency-modulation phase-locked loop synthesizer comprising a phase comparator, the phase comparator including a gate delay element that operates as a ring oscillator upon locking of a specific frequency and prevents a dead band in fractional frequency operation.

2. The synthesizer according to claim 1, further comprising at least one transmission gate, wherein the gate delay element is controlled using the transmission gate.

3. The synthesizer according to claim 2, wherein the transmission gate is controlled by a set signal used for frequency alteration.

4. A fractional-frequency-modulation phase-locked loop synthesizer comprising:

a reference frequency divider that divides a reference frequency generated by a reference oscillator by a fixed divisor to generate a reference frequency signal;

a phase comparator that compares phases of the reference frequency signal and a frequency divided signal to produce a phase error and outputs an UP or a DOWN signal based on the phase error, the phase comparator including a gate delay element, the gate delay element operating as a dead band prevention delay element that generates a delay time to prevent generation of a dead band in the UP signal and the DOWN signal, and as a ring oscillator that outputs a delay time when locking the frequency of a signal output by a voltage controlled oscillator;

a charge pump circuit that outputs a specific signal based on the UP and DOWN signals output by the phase comparator, wherein the frequency of the signal output by the voltage control oscillator is modulated based on the specific signal; and a variable frequency divider that divides the signal output by the voltage controlled oscillator by changing a frequency divisor periodically between N and N+1, where N is an integer, to output the frequency divided signal.

5. The synthesizer according to claim 4, further comprising at least one transmission gate, wherein the gate delay element is controlled using the transmission gate.

6. The synthesizer according to claim 5, wherein the transmission gate is controlled by a set signal for frequency alteration.

* * * * *